United States Patent
Yamasaki et al.

(10) Patent No.: US 11,313,897 B2
(45) Date of Patent: Apr. 26, 2022

(54) TESTING WAFER AND TESTING METHOD

(71) Applicant: TOKYO ELECTRON LIMITED, Tokyo (JP)

(72) Inventors: Yoshihito Yamasaki, Singapore (SG); Hiroshi Yamada, Japan (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 36 days.

(21) Appl. No.: 16/878,420

(22) Filed: May 19, 2020

(65) Prior Publication Data

US 2020/0371156 A1 Nov. 26, 2020

(30) Foreign Application Priority Data

May 23, 2019 (JP) .............................. JP2019-096722

(51) Int. Cl.
*G01R 31/28* (2006.01)

(52) U.S. Cl.
CPC ..... *G01R 31/2874* (2013.01); *G01R 31/2893* (2013.01)

(58) Field of Classification Search
CPC ............ G01R 31/2874; G01R 31/2893; G01R 31/2875
See application file for complete search history.

(56) References Cited

U.S. PATENT DOCUMENTS

| 2010/0156449 | A1* | 6/2010 | Nitta | ................. | G01R 31/2875 |
| | | | | | 324/756.03 |
| 2017/0363680 | A1* | 12/2017 | Saito | ................. | G01R 1/07378 |
| 2018/0017594 | A1* | 1/2018 | Tamura | .............. | G01R 1/07314 |

FOREIGN PATENT DOCUMENTS

JP 2012-231040 A 11/2012

* cited by examiner

*Primary Examiner* — Akm Zakaria
(74) *Attorney, Agent, or Firm* — Fenwick & West LLP (57) ABSTRACT

There is provided a testing wafer that simulates heat generation of an inspection target substrate. The testing wafer includes a heater pattern, a plurality of temperature sensors, and first and second electrode pads. The heater pattern is configured to heat the testing wafer having the same shape as a shape of the inspection target substrate. The temperature sensors are configured to respectively measure temperatures of multiple locations on the testing wafer. The first electrode pads are connected to the heater pattern and the second electrode pads are connected to the temperature sensors. The first and second electrode pads are installed to be in contact with probes of a probe card.

7 Claims, 6 Drawing Sheets

TESTING WAFER AND TESTING METHOD

CROSS-REFERENCE TO RELATED APPLICATIONS

This application claims priority to Japanese Patent Application No. 2019-096722, filed on May 23, 2019, the entire contents of which are incorporated herein by reference.

TECHNICAL FIELD

The present disclosure relates to a testing wafer and a testing method.

BACKGROUND

A prober is known as an example of an inspection device for inspecting a wafer on which a plurality of semiconductor devices is formed. The prober includes a probe card having multiple columnar contact terminals that are contact probes. In the prober, the contact probes are brought into contact with electrode pads or solder bumps of the semiconductor devices by bringing the probe card into contact with the wafer. The prober inspects conduction states of electric circuits of the semiconductor devices by allowing electricity to flow from the contact probes to the electric circuits of the semiconductor devices connected to the electrode pads or the solder bumps (see, e.g., Japanese Patent Application Publication No. 2012-231040).

The present disclosure provides a testing wafer to which thermal stress can be applied in a vacuum attraction state and a testing method therefor.

SUMMARY

In accordance with an aspect of the present disclosure, there is provided a testing wafer that simulates heat generation of an inspection target substrate, including: a heater pattern configured to heat the testing wafer having the same shape as a shape of the inspection target substrate; a plurality of temperature sensors configured to respectively measure temperatures of multiple locations on the testing wafer; and first electrode pads connected to the heater pattern and second electrode pads connected to the temperature sensors, the first and second electrode pads being installed to be in contact with probes of a probe card.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, a testing wafer and a testing method according to embodiments of the present disclosure will be described in detail with reference to the accompanying drawings. The following embodiments are not intended to limit the present disclosure.

Recently, a wafer inspection device including a plurality of probe cards and capable of improving wafer inspection efficiency using the probe cards has been developed. In the wafer inspection device, while a wafer is being transferred to one probe card by a transfer stage, it is possible to inspect semiconductor devices on a wafer by another probe card. In the wafer inspection device, in order to bring each wafer into contact with the probe card, the wafer is mounted on a chuck top that is a thick plate member and the space between the probe card and the chuck top is vacuum-evacuated so that the wafer is brought into contact with the probe card together with the chuck top. Here, when bringing the wafer into contact with the probe card, the chuck top is mounted on a stage and the stage moves together with the chuck top toward the probe card. Then, the chuck top is coupled by vacuum attraction force with the probe card and separated from the stage.

However, the inspection conditions for inspecting a wafer recently has become complicated. Particularly, the inspection is often performed under a high-temperature environment or a low-temperature environment. In this case, it is necessary to control the temperature of the chuck top (substrate support table) to a temperature at which the inspection can be performed. For example, it is suggested to calibrate the inspection device using a calibration wafer having a resistance temperature detector and control the temperature to the inspection temperature using the calibrated inspection device to perform the inspection. Since, however, the devices on the inspection target wafer generate heat due to a current flowing therethrough, the temperature of the chuck top may increase if a chiller of the inspection device has insufficient performance. Therefore, in order to examine the performance of the chiller, using a jig for applying thermal stress in a state open to the atmosphere is considered. However, in the state open to the atmosphere, heat escapes from the chuck top to the atmosphere unlike a vacuum attraction state, and it is difficult to apply the same thermal stress as that applied in the vacuum attraction state. Accordingly, a testing wafer to which thermal stress can be applied in the vacuum attraction state is desired.

First Embodiment

Configuration Of Wafer Inspection Device 10

Figure 1:
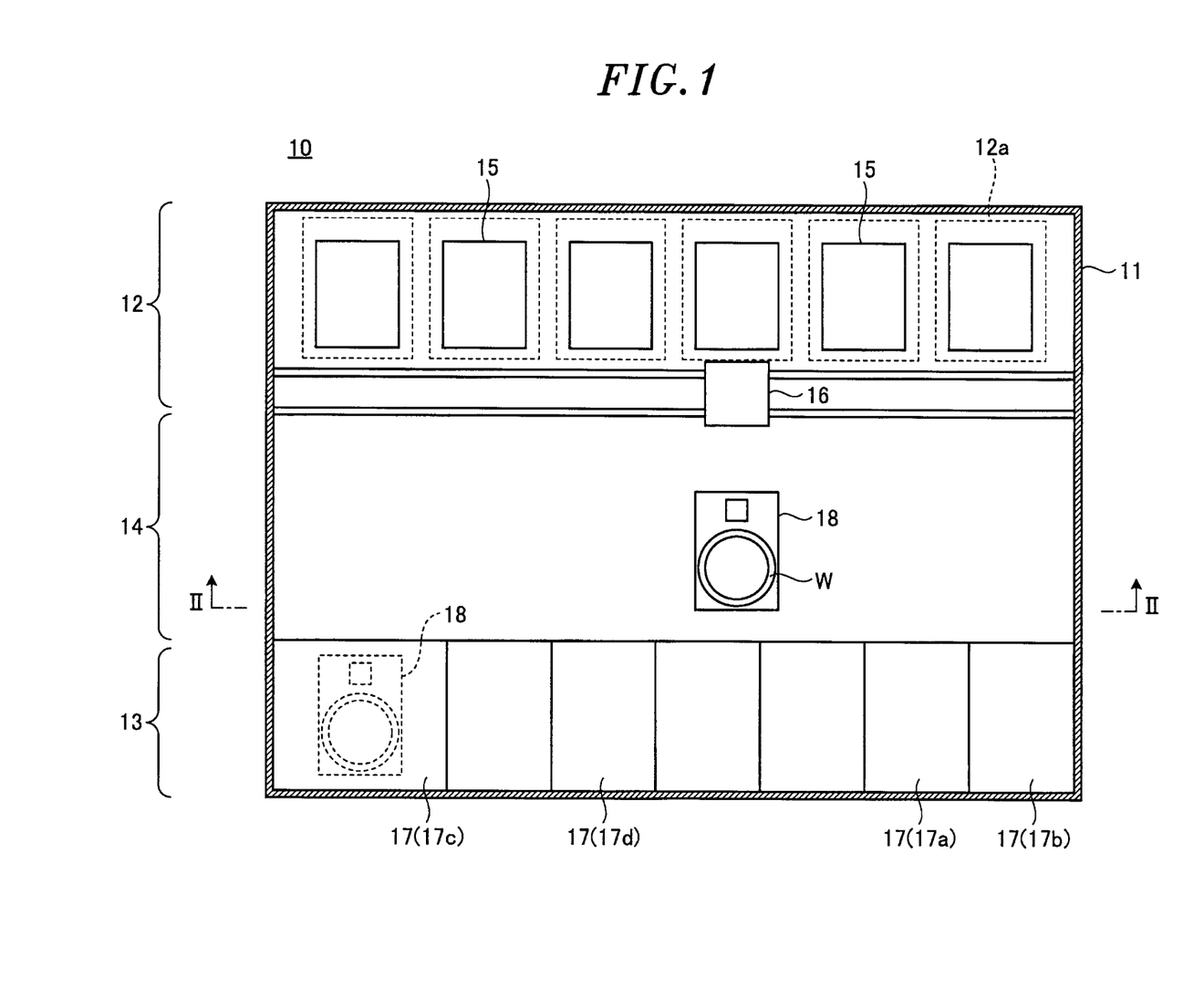
FIG. 1 shows an example of a wafer inspection device according to a first embodiment of the present disclosure.
Figure 2:
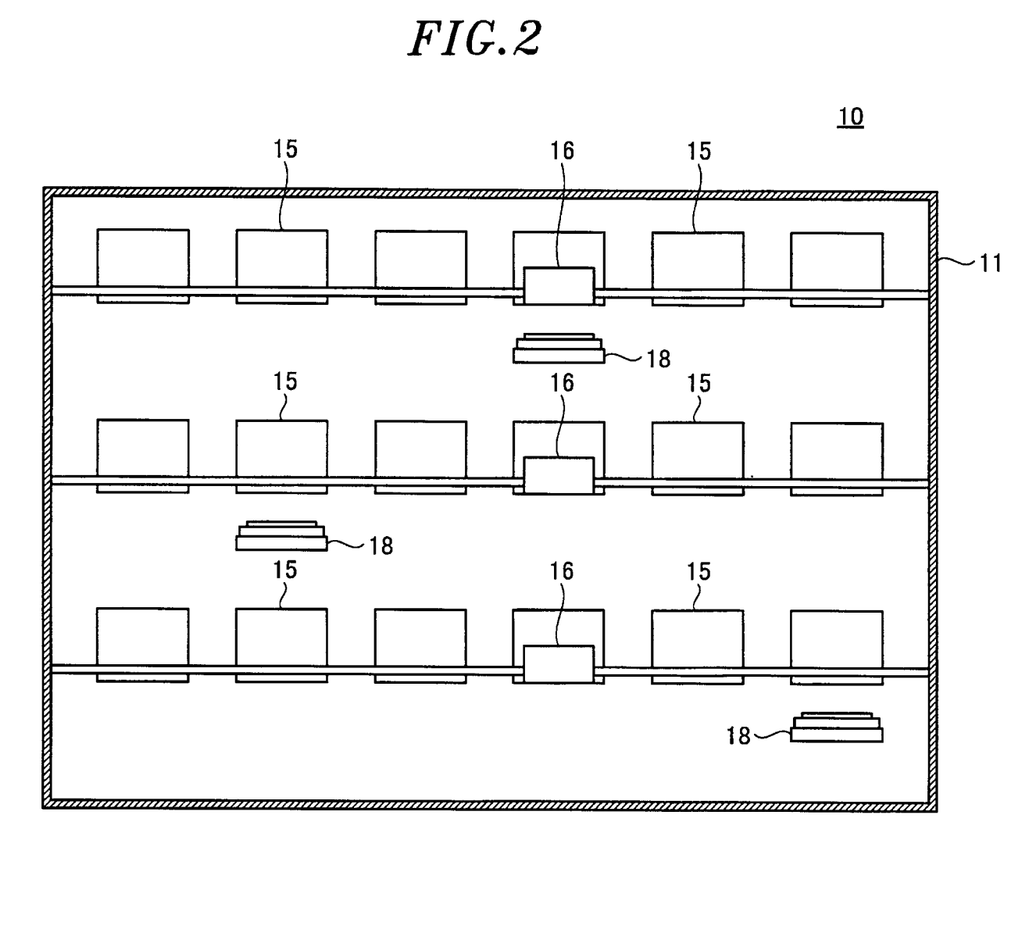
FIG. 2 is a cross-sectional view taken along a line II-II of FIG. 1.

FIG. 1 shows an example of a wafer inspection device according to the first embodiment of the present disclosure. FIG. 2 is a cross-sectional view taken along a line II-II of FIG. 1. The wafer inspection device 10 shown in FIGS. 1 and 2 includes a testing chamber 11. The testing chamber 11 has a testing area 12 for testing electrical characteristics of the semiconductor devices of the wafer W, a loading/unloading area 13 for loading and unloading the wafer W into and from the testing chamber 11, and a transfer area 14 disposed between the testing area 12 and the loading/unloading area 13.

A plurality of testers 15, each serving as a wafer inspection interface, are disposed in the testing area 12. A plurality of inspection spaces 12a are disposed in the testing area 12 to respectively correspond to the testers 15. Specifically, in the testing area 12, the plurality of testers is horizontally arranged in a row and rows of the testers are respectively arranged in three stages. A single tester-side camera 16 is disposed in each stage. The tester-side camera 16 moves horizontally along the row of each stage and is located in front of each of the testers 15 in the corresponding row to check the position of the wafer W transferred by a transfer stage 18 to be described later, or the incline of a chuck top 29 to be described later.

The loading/unloading area 13 is divided into a plurality of storages 17. Disposed in the storages 17 are a port 17a, an aligner 17b, a loader 17c, and a controller 17d. A port 17a receives a FOUP that is a container accommodating a plurality of wafers. The aligner 17b performs position-alignment of the wafer. A probe card 19 to be described later is loaded into and unloaded from the loader 17c. The controller 17d controls the operations of the respective components of the wafer inspection device 10.

In the transfer area 14, the transfer stage 18 that can move to the testing area 12 and the loading/unloading area 13 as well as the transfer area 14 is disposed. The transfer stage 18 is provided for the row of each stage to receive the wafer W from the port 17a of the loading/unloading area 13 and transfer the wafer W to each inspection space 12a. Further, the transfer stage 18 transfers the wafer W having the semiconductor devices whose electrical characteristics have been inspected from each inspection space 12a to the port 17a.

In the wafer inspection device 10, each tester 15 inspects the electrical characteristics of the semiconductor devices of the wafer W transferred thereto. In the wafer inspection device 10, while the transfer stage 18 is transferring the wafer W to one inspection space 12a, it is possible to inspect electrical characteristics of semiconductor devices of a different wafer W in a different inspection space 12a. Accordingly, the wafer inspection efficiency can be improved.

Figure 3:
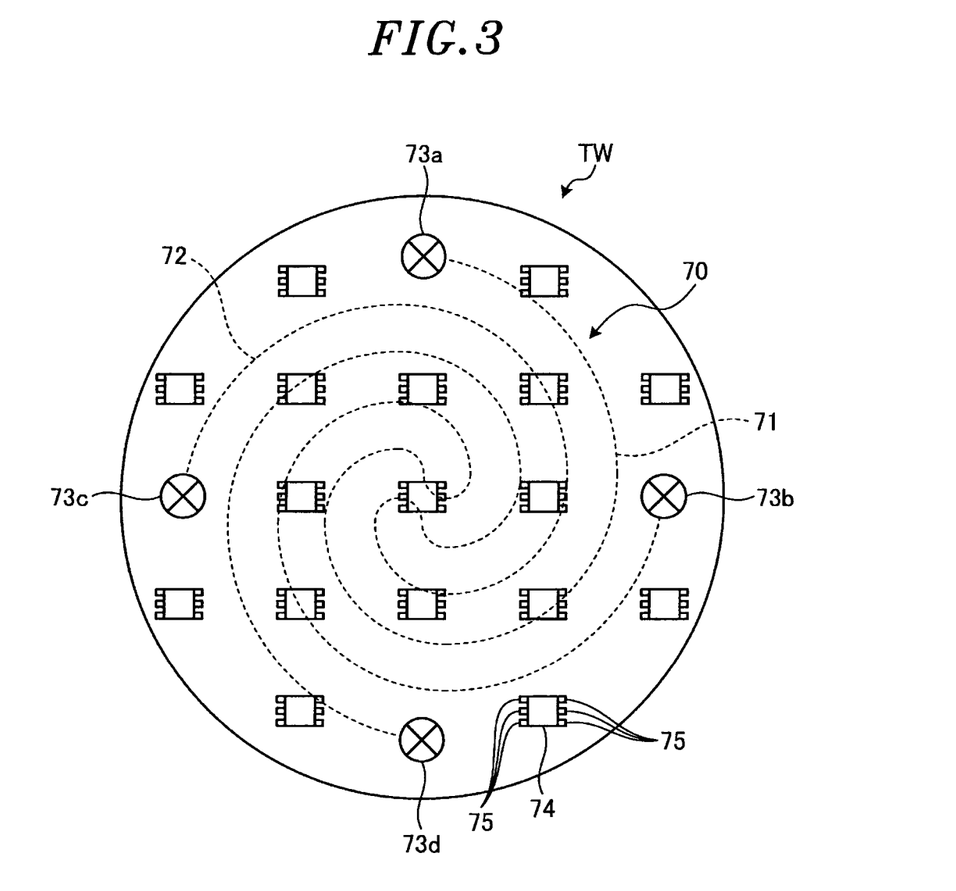
FIG. 3 shows an example of a configuration of a testing wafer according to the first embodiment of the present disclosure.

Here, a testing wafer for examining the performance of the chiller of the wafer inspection device 10 will be described with reference to FIG. 3. FIG. 3 shows an example of a configuration of the testing wafer according to the first embodiment of the present disclosure. As shown in FIG. 3, a testing wafer TW has substantially the same shape as that of the wafer W that is an inspection target substrate. The testing wafer TW simulates heat generation of the devices on the inspection target wafer W. As an example of the testing wafer TW, a circular silicon wafer having a diameter of 200 mm to 300 mm can be used. The testing wafer TW has a heater pattern 70 and a plurality of temperature sensors 74.

The heater pattern 70 has, e.g., spiral-shaped resistance heaters 71 and 72 formed in the testing wafer TW. The resistance heaters 71 and 72 are obtained by stacking a metal such as tungsten or the like on the testing wafer TW and covering the surface thereof with an insulator. The resistance heaters 71 and 72 may be other types of heaters for performing resistance heating. For example, heaters made of nickel-chromium alloy, silicon carbide (SiC), carbon, or the like may be used. The heater pattern 70 does not necessarily have a spiral shape and may be another pattern as long as the in-plane heat density of the testing wafer TW is uniform.

Electrode pads 73a and 73b for power supply are connected to both ends of the resistance heater 71. Further, Electrode pads 73c and 73d for power supply are connected to both ends of the resistance heater 72. In the following description, the electrode pads 73a to 73d may be simply referred to as "electrode pads 73" unless otherwise stated. The electrode pads 73 are disposed on the upper surface of the testing wafer TW and are brought into contact with contact probes 25 of the probe card 19 of the wafer inspection device 10 to be described later. In the example of FIG. 3, the heater pattern 70 has the two resistance heaters 71 and 72. However, the heater pattern 70 may have one resistance heater or three or more resistance heaters depending on the amount of heat generated by the wafer W to be simulated.

The temperature sensors 74 are attached to, e.g., multiple locations on the upper surface (top face) of the testing wafer TW to respectively measure the temperatures at the locations. The number of the temperature sensors 74 may be, e.g., about 10 to 20. However, the number of the temperature sensors 74 may be less than 10 or more than 20 as long as the heater pattern 70 can be controlled. The temperature sensors 74 may be, e.g., digital temperature sensors. The temperature sensors 74 have an accuracy of ±0.3° C. (maximum value) within a range of, e.g., 55° C. to +150° C. The temperature sensors 74 have interfaces such as I2C or SMBus and output temperature data. The size of each of the temperature sensors 74 shown in FIG. 3 is greater than the actual size for the sake of convenience in description. Each temperature sensor 74 has the actual size of, e.g., about 2 mm×2 mm with a thickness of about 0.8 mm, or about 1.5 mm×0.95 mm with a thickness of about 0.5 mm.

A plurality of electrode pads 75 for power supply and communication is disposed around each temperature sensor 74. The electrode pads 75 are disposed on the upper surface of the testing wafer TW and are brought into contact with the contact probe 25 of the probe card 19 to be described later, similar to the electrode pads 73. The temperature sensors 74 and the electrode pads 75 may be arranged to be overlapped with the resistance heaters 71 and 72. Alternatively, the temperature sensors 74 may be embedded between two wafers and the electrode pads 75 may be disposed on the surface of the wafer that faces the probe card 19. In this case, the electrode pads 73 are also disposed on the surface of the wafer that faces the probe card 19.

The amount of heat generated by the heater pattern 70 (the power applied to the heater pattern 70) is controlled based on, e.g., the average value of the temperatures measured by the temperature sensors 74 such that the temperature of the entire testing wafer TW becomes equal to the temperature of the entire wafer W that is an inspection target to be simulated. If the temperature sensors 74 are controlled in association with each of the resistance heaters 71 and 72 of the heater pattern 70, the amount of heat generated by each of the resistance heaters 71 and 72 may be controlled based on the temperature measurement values for each of the resistance heaters 71 and 72.

Figure 4:
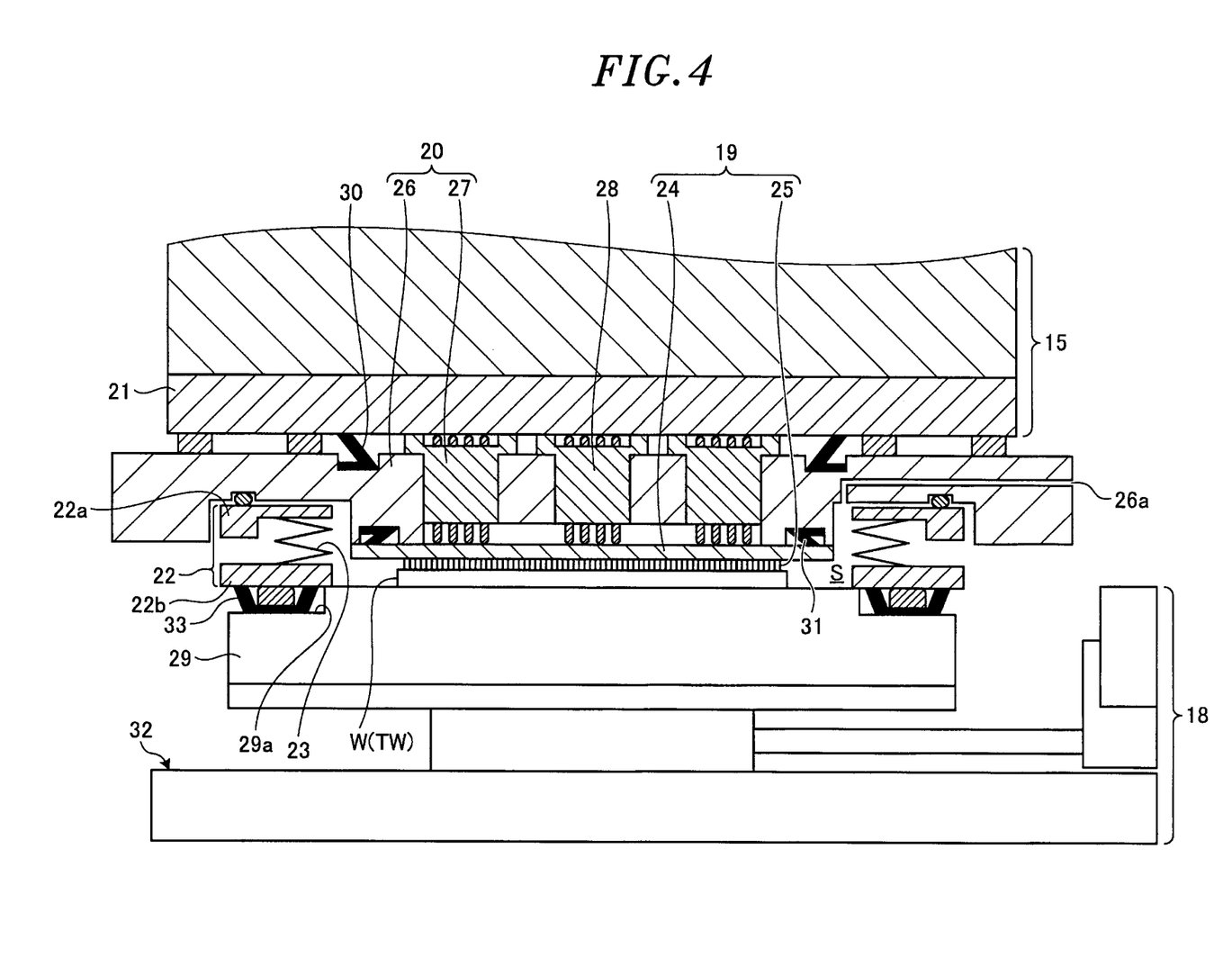
FIG. 4 shows an example of a configuration of a transfer stage and a tester according to the first embodiment.

Next, the configuration of the transfer stage and the tester will be described with reference to FIGS. 4 and 5. FIG. 4 shows an example of a configuration of the transfer stage and the tester according to the first embodiment. In other words, FIG. 4 shows a state in which the transfer stage 18 brings the wafer W into contact with the probe card 19 of the tester 15 and mainly shows a cross-sectional view of the configuration in the inspection space 12a. In FIG. 4, the inspection using the wafer W is described. However, the following description can also be applied to the inspection using the testing wafer TW.

In FIG. 4, the tester 15 is disposed on a pogo frame 20 fixed to a device frame (not shown). The probe card 19 is attached onto the bottom of the pogo frame 20. A flange 22 is disposed to surround the probe card 19.

The probe card 19 includes a circular plate-shaped main body 24, a plurality of electrodes (not shown) disposed substantially on the entire upper surface of the main body 24, and a plurality of contact probes 25 (contact terminals)

protruding downward from the bottom surface of the main body 24 as shown in FIG. 4. The electrodes are connected to corresponding contact probes 25. When the wafer W is brought into contact with the probe card 19, the contact probes 25 are brought into contact with the electrode pads or the solder bumps of the semiconductor devices formed on the wafer W. In the case of using the testing wafer TW, the contact probes 25 are brought into contact with the electrode pads 73 and 75.

The pogo frame 20 includes a substantially flat plate-shaped main body 26 and a plurality of pogo block insertion holes 27, i.e., through-holes, formed at the central portion of the main body 26. A pogo block 28 formed by arranging multiple pogo pins is inserted into each of the pogo block insertion holes 27. The pogo blocks 28 are connected to a testing circuit (not shown) of the tester 15 and brought into contact with a plurality of electrodes on the upper surface of the main body 24 of the probe card 19 attached to the pogo frame 20. The pogo blocks 28 allow a current to flow to the contact probes 25 of the probe card 19 connected to the corresponding electrodes and also allow a current flowing from the electric circuits of the semiconductor devices of the wafer W to the testing circuit through the contact probes 25. In the case of using the testing wafer TW, the pogo blocks 28 transmit temperature data signals outputted from the temperature sensors 74 to the testing circuit and output the current (power) controlled based on the temperature data toward the heater pattern 70.

The flange 22 has an upper flange 22a and a lower flange 22b. The flange 22 has a cylindrical bellows 23 between the upper flange 22a and the lower flange 22b. The upper flange 22a is engaged with the pogo frame 20 and is sealed using packing or the like. The lower flange 22b is vertically movable with respect to the pogo frame 20.

The lower flange 22b is moved downward due to its own weight such that the bottom surface of the lower flange 22b is positioned lower than the tip ends of the contact probes 25 of the probe card 19 until the chuck top 29 is brought into contact with the lower flange 22b. The bellows 23 is a metal bellows configured to be vertically expandable and contractible. The lower end and the upper end of the bellows 23 are in contact with the upper surface of the lower flange 22b and the bottom surface of the upper flange 22a, respectively.

The space between the pogo frame 20 and a base 21 of the tester 15 is sealed with a sealing member 30. By vacuum-evacuating the space, the base 21 is coupled to the pogo frame 20. The space between the pogo frame 20 and the probe card 19 is sealed with a sealing member 31. By vacuum-evacuating the space, the probe card 19 is coupled to the pogo frame 20.

The transfer stage 18 includes an aligner 32 and a chuck top 29 that is a thick plate member. The chuck top 29 is supported on the aligner 32, and the wafer W is supported on the upper surface of the chuck top 29. The chuck top 29 is held onto the aligner 32 by vacuum attraction force, and the wafer W is held onto the chuck top 29 by vacuum attraction force. Therefore, it is possible to prevent the relative movement of wafer W with respect to the transfer stage 18 during the movement of the transfer stage 18. The method of holding the chuck top 29 and the wafer W is not limited to the vacuum attraction and may be any method capable of preventing the relative movement of the chuck top 29 and the wafer W with respect to the aligner 32. For example, the chuck top 29 and the wafer W may be held by, e.g., electromagnetic attraction or coupled by clamping. A stepped portion 29a is formed on a peripheral edge of the upper surface of the chuck top 29, and a sealing member 33 is disposed on the stepped portion 29a.

The transfer stage 18 is movable and thus can move to a position below the probe card 19 of the inspection space 12a so that the wafer W supported on the chuck top 29 can face the probe card 19 and the wafer W can also be moved toward the tester 15. A space S is formed when the chuck top 29 is brought into contact with the lower flange 22b and the wafer W is brought into contact with the probe card 19. In other word, the space S is surrounded by the chuck top 29, the flange 22, the pogo frame 20, and the probe card 19, and is sealed by the bellows 23 and the sealing member 33. In the space S, the chuck top 29 is held by the probe card 19 by evacuating the space S through a vacuum line 26a. In the space S, the wafer W supported on the chuck top 29 is brought into contact with the probe card 19. At this time, the electrode pads or the solder bumps of the semiconductor devices on the wafer W are brought into contact with the contact probes 25 of the probe card 19. In the case of using the testing wafer TW, the electrode pads 73 and 75 are brought into contact with the contact probes 25 of the probe card 19. In the wafer inspection device 10, the movement of the transfer stage 18 is controlled by the controller 17d, and the controller 17d checks the position and the amount of movement of the transfer stage 18.

The aligner 32 adjusts the relative position and the incline of the chuck top 29 with respect to the probe card 19. In the wafer inspection device 10, the chuck top 29 of each inspection space 12a has a built-in temperature control mechanism such as a heater, a coolant channel, or the like (all not shown), and the inspection is performed under a high-temperature environment or a low-temperature environment. Therefore, the aligner 32 adjusts the position and the incline that are changed by the deformation of the probe card 19 or the chuck top 29 due to the radiation of heat from the heater built in the chuck top 29 or the absorption of heat into the coolant channel during the inspection performed under the high-temperature environment or the low-temperature environment. The temperature may be within a range of, e.g., 130° C. to −40° C.

Figure 5:
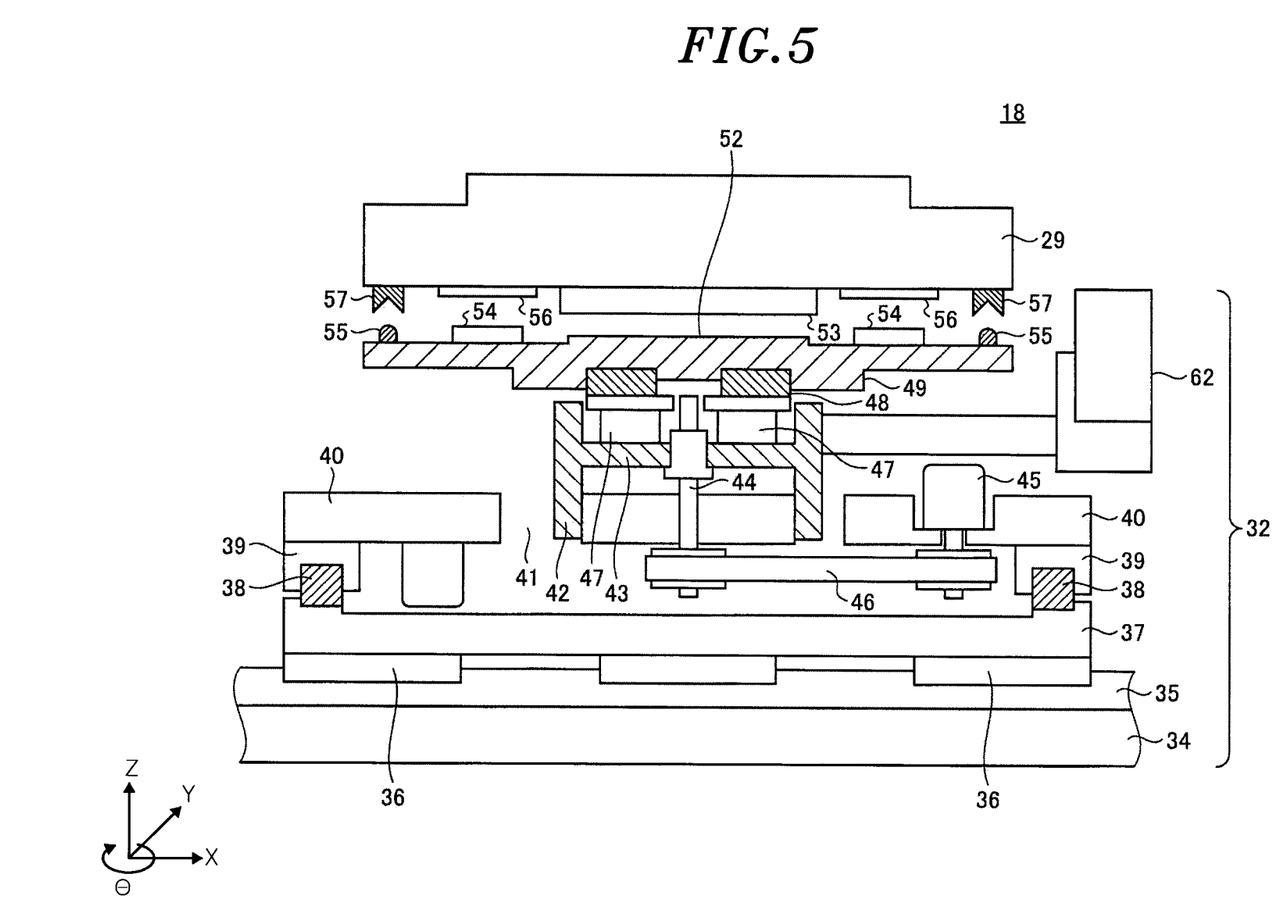
FIG. 5 shows a detailed example of the configuration of the transfer stage.

FIG. 5 shows a detailed example of the configuration of the transfer stage. In FIG. 5, the aligner 32 is transparent so that the inside thereof can be seen for the sake of better understanding. FIG. 5 shows a state in which the chuck top 29 is separated from the aligner 32. In FIG. 5, the X-direction indicates a right-left direction; the Z-direction indicates a vertical direction; the Y-direction indicates a depth direction; and a θ-direction indicates a rotation direction about the Z-direction.

As shown in FIG. 5, the aligner 32 includes a plate-shaped X base 34, an X guide 35, X blocks 36, a Y base 37, a Y guide 38, Y blocks 39, and a Z base 40. The X guide 35 is a rail-shaped guide extending on the X base 34 in the X-direction. The X blocks 36 are a plurality of blocks capable of moving in the X-direction while being engaged with the X guide 35. The Y base 37 is a plate-shaped member supported by the X blocks 36. The Y guide 38 is a rail-shaped guide extending on the Y base 37 in the Y-direction. The Y blocks 39 are a plurality of blocks capable of moving in the Y-direction while being engaged with the Y guide 38. The Z base 40 is a plate-shaped member supported by the Y blocks 39. The Y base 37 can be moved in the X-direction with respect to the X base 34 as the X blocks 36 are moved in the X-direction. The Z base 40 can be moved in the Y-direction with respect to the Y base 37 and the X base 34 as the Y blocks 39 are moved in the Y-direction.

A Z block hole 41 is formed at the center of the Z base 40, and a Z block 42 having an H-shaped cross section is loosely fitted into the Z block hole 41 The Z block 42 has a flange-shaped portion 43 therein, and the flange-shaped portion 43 is screwed to a ball screw 44 extending in the Z-direction. The ball screw 44 rotates about the Z axis by a rotational force transmitted from a Z-axis motor 45 via a driving belt 46, and the flange-shaped portion 43 that is screwed to the rotating ball screw 44 moves in the Z-direction. Accordingly, the Z block 42 moves in the Z-direction along a guide (not shown). A plurality of actuators 47 is disposed on the upper surface of the flange-shaped portion 43. Each actuator 47 supports a substantially disc-shaped chuck base 49 via a roller ring 48. The roller ring 48 has a θ-direction driving mechanism (not shown) to rotate the chuck base 49 in the θ-direction while supporting the chuck base 49. The number of the actuators 47 may be two or more. For example, three actuators 47 may be disposed, or two actuators 47 and one height fixing member (not shown) may be disposed. The chuck base 49 is rotated in the θ-direction by a structure that is not shown. The chuck base 49 has a chuck top attraction surface 52 at the central portion of the upper surface thereof, and a bottom plate 53 of the chuck top 29 is held onto the chuck top attraction surface 52 by the vacuum attraction force. Accordingly, the chuck top 29 is supported on and attached to the aligner 32. The chuck base 49 has, on the peripheral portion of the upper surface thereof, a plurality of height sensors 54 and positioning pins 55, each having a hemispherical upper end. The chuck top 29 has, on the bottom surface thereof, a plurality of detection plates 56 disposed to respectively face the height sensors 54 and a plurality of positioning blocks 57 disposed to respectively face the positioning pins 55.

When the chuck top 29 is mounted on the aligner 32, the height sensors 54 measure the distances from the upper surface of the chuck base 49 to the bottom surface of the chuck top 29, i.e., the relative positional relationship between the chuck top 29 and the chuck base 49 (the aligner 32). Specifically, the height sensors 54 measure the individual distances (hereinafter, referred to as "chuck top heights") from the height sensors 54 to the corresponding detection plates 56. The measured chuck top heights are stored in, e.g., a memory of the controller 17d. The chuck top heights are measured by the individual height sensors 54. Here, when the chuck top 29 is mounted on the aligner 32, the chuck top 29 and the chuck base 49 may not be completely in parallel with each other due to factors such as the incline of the chuck top attraction surface 52 and the like. In other words, when the chuck top height measured by one height sensor 54 is 500 µm, the chuck top height measured by another height sensor 54 may be 550 µm because the chuck top 29 is slightly inclined with respect to the chuck base 49. In the wafer inspection device 10, the chuck top heights measured by the height sensors 54 are stored in association with the height sensors 54.

The lower ends of the positioning blocks 57 have a conical shape and are engaged with the hemispherical upper ends of the corresponding positioning pins 55. In the wafer inspection device 10, the position of the chuck top 29 with respect to the chuck base 49 (the aligner 32) is determined by engaging the positioning blocks 57 with the corresponding positioning pins 55.

In addition, the aligner 32 has an upper checking camera 62 for checking a degree of inclination of the probe card 19 or the pogo frame 20. The upper checking camera 62 is attached to the Z block 42. In the aligner 32, the chuck base 49 is lifted by the actuators 47. The lifting amounts of the actuators 47 can be adjusted individually. In other words, the aligner 32 can adjust the incline of the chuck base 49 and eventually the incline of the chuck top 29 by setting the lifting amounts of the actuators 47 to be different.

Testing Method

Figure 6:
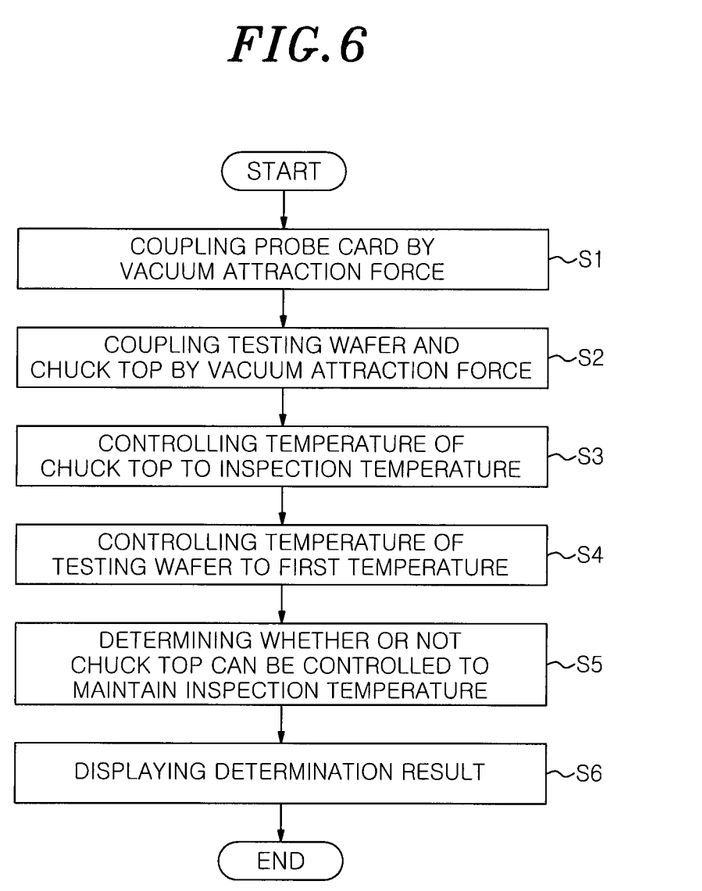
FIG. 6 is a flowchart showing an example of a testing method according to the first embodiment.

Next, the testing method according to the first embodiment will be described. FIG. 6 is a flowchart showing an example of the testing method according to the first embodiment.

In the wafer inspection device 10, the probe card 19 is transferred by the transfer stage 18 from the loader 17c to the inspection space 12a where the inspection is performed. In the wafer inspection device 10, the probe card 19 is coupled to the pogo frame 20 from the transfer stage 18 by the vacuum attraction force (step S1).

Next, in the wafer inspection device 10, the chuck top 29 having the testing wafer TW thereon is transferred by the transfer stage 18 to the probe card 19 that will perform the inspection. In the wafer inspection device 10, the chuck top 29 having the testing wafer TW thereon is transferred to a position below the probe card 19 by the transfer stage 18. In the wafer inspection device 10, the chuck top 29 is lifted to bring the electrode pads 73 and 75 of the testing wafer TW into contact with the contact probes 25 of the probe card 19. In the wafer inspection device 10, the testing wafer TW and the chuck top 29 are coupled to the probe card 19 by the vacuum attraction force (step S2).

In the wafer inspection device 10, the transfer stage 18 retreats from the inspection space 12a, and a temperature control mechanism (chiller) (not shown) of the chuck top 29 controls the temperature of the chuck top 29 to an inspection temperature (step S3). For example, in the wafer inspection device 10, when the inspection temperature is −40° C., the coolant of −45° C. and the heater in the chuck top 29 are controlled to maintain the temperature at −40° C. If the temperature of the chuck top 29 has been controlled to the inspection temperature in advance, step S3 can be omitted.

The tester 15 acquires the temperature data measured by the temperature sensors 74 of the testing wafer TW. The tester 15 calculates, e.g., the average value of the temperatures of the entire testing wafer TW based on the acquired temperature data. The tester 15 controls the amount of heat generated by the heater pattern 70 based on the calculated average value of the temperatures such that the temperature of the entire testing wafer TW becomes a first temperature that is a temperature of the entire wafer W to be simulated (step S4). The first temperature is determined based on the amount of heat generated by the devices of the inspection target wafer W. In other words, the first temperature is a temperature at which the amount of heat generated by the entire inspection target wafer W and the cooling performance of the chuck top 29 are balanced.

In the wafer inspection device 10, it is determined whether or not the chuck top 29 can control its own chiller to maintain the inspection temperature (second temperature) (step S5). In the wafer inspection device 10, the determination result is displayed on, e.g., a display unit (not shown) (step S6). In the wafer inspection device 10, when the inspection is completed, the testing wafer TW and the chuck top 29 are unloaded from the inspection space 12a by the transfer stage 18.

In the first embodiment, the thermal stress can be applied in a vacuum-attraction state in the inspection for examining the performance of the chiller. Further, in the first embodiment, since the inspection can be performed during the general position-alignment, it is not necessary to wait for dew point recovery that is required when the cover of the testing chamber 11 is open to install a jig at the chuck top 29.

In the above-described steps S4 and S5, the inspection may be performed in the case of applying the same power as that applied to inspect the inspection target wafer W to the heater pattern 70 of the testing wafer TW. For example, instead of step S4, the tester 15 applies the same power as that applied to inspect the inspection target wafer W to the heater pattern 70 of the testing wafer TW. Further, instead of step S5, in the wafer inspection device 10, it is determined whether or not the chuck top 29 can control its own chiller to maintain the inspection temperature (the second temperature) by determining whether or not the temperatures measured by the temperature sensors 74 are within a specified value. In this case as well, the first temperature corresponds to a temperature at which the amount of heat generated by the entire inspection target wafer W and the cooling performance of the chuck top 29 are balanced.

Second Embodiment

In the first embodiment, the testing wafer TW is controlled to the first temperature by using the tester 15 of the wafer inspection device 10. However, the testing wafer TW may be controlled to the first temperature by using a testing jig instead of the tester 15. Similar to the tester 15, the jig calculates, e.g., the average value of the temperatures of the entire testing wafer TW based on the temperature data measured by the temperature sensors 74. The jig controls the amount of heat generated by the heater pattern 70 based on the calculated average value of the temperatures such that the temperature of the entire testing wafer TW becomes the first temperature. In this manner, in the second embodiment, the thermal stress can be applied in a vacuum-attraction state without using the tester 15 in the inspection for examining the performance of the chiller.

In accordance with the first embodiment, the testing wafer TW that simulates the heat generation of the inspection target substrate (the wafer W) includes the heater pattern 70, the temperature sensors 74, and the electrode pads 73 and 75. The heater pattern 70 heats the testing wafer TW having the same shape as that of the inspection target substrate. The temperature sensors 74 respectively measure the temperatures of the multiple locations on the testing wafer TW. The electrode pads 73 are connected to the heater pattern 70 and the electrode pads 75 are connected to the temperature sensors 74. The electrode pads 73 and 75 are installed to be in contact with the probes of the probe card 19. Accordingly, the thermal stress can be applied in a vacuum-attraction state.

In accordance with the first embodiment, the power applied to the heater pattern 70 is controlled based on the temperatures measured by the temperature sensors 74. Accordingly, the temperature of the entire testing wafer TW can be controlled.

In accordance with the first embodiment, the heater pattern 70 is formed in the testing wafer TW, so that the testing wafer TW can be heated.

In accordance with the first embodiment, the temperature sensors 74 are attached to the surface of the testing wafer TW, so that the surface temperature of the testing wafer TW can be measured.

In accordance with the first embodiment, the heater pattern 70 is disposed in a spiral shape, so that the testing wafer TW can be heated substantially uniformly.

In accordance with the first embodiment, the testing wafer TW and the chuck top 29 holding the testing wafer TW are coupled to the pogo frame 20 supporting the probe card 19 by the vacuum attraction force. The inspection using the testing wafer TW is performed in a state where the space between the testing wafer TW and the probe card 19 is vacuum-evacuated. Accordingly, the thermal stress can be applied to the chuck top 29 in a vacuum attraction state.

In accordance with the first embodiment, in the testing method of the wafer inspection device 10 using the testing wafer TW that simulates the heat generation of the inspection target substrate, the chuck top 29 holding the testing wafer TW is coupled to the probe card 19 by vacuum attraction force, the probe card 19 having the probes to be in contact with the testing wafer TW. Further, in the testing method, the temperature of the testing wafer TW is controlled to the first temperature that is determined based on the amount of heat generated by the inspection target substrate by using the heater pattern 70 formed in the testing wafer TW to heat the testing wafer TW and the temperature sensors 74 for measuring the temperatures of the multiple locations on the testing wafer TW. Moreover, in the testing method, it is determined whether or not the wafer inspection device 10 can control the chuck top 29 to maintain the second temperature. Accordingly, the inspection for accurately examining the performance of the chiller can be performed by applying the thermal stress in a vacuum attraction state.

The embodiments of the present disclosure are illustrative in all respects and are not restrictive. The above-described embodiments can be embodied in various forms. Further, the above-described embodiments may be omitted, remounted, or changed in various forms without departing from the scope of the appended claims and the gist thereof.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A testing wafer that simulates heat generation of an inspection target substrate, comprising:
    a heater pattern configured to heat the testing wafer having the same shape as a shape of the inspection target substrate;
    a plurality of temperature sensors configured to respectively measure temperatures of multiple locations on the testing wafer; and
    first electrode pads connected to the heater pattern and second electrode pads connected to the temperature sensors, the first and second electrode pads being installed to be in contact with probes of a probe card,
    wherein an amount of heat generated by the heater pattern is controlled based on the temperatures measured by the temperature sensors such that a temperature of the testing wafer becomes a temperature of the inspection tar et substrate to be simulated.

2. The testing wafer of claim 1, wherein a power applied to the heater pattern is controlled based on the temperatures measured by the temperature sensors.

3. The testing wafer of claim 1, wherein the heater pattern is formed in the testing wafer.

4. The testing wafer of claim 1, wherein the temperature sensors are attached to a surface of the testing wafer.

5. The testing wafer of claim 1, wherein the heater pattern is disposed in a spiral shape.

6. The testing wafer of claim 1, wherein the testing wafer and a chuck top holding the testing wafer are coupled to a pogo frame supporting the probe card by vacuum attraction force, and
    inspection using the testing wafer is performed in a state where a space between the testing wafer and the probe card is vacuum-evacuated.

7. A testing method of an inspection device using a testing wafer that simulates heat generation of an inspection target substrate, comprising:
    coupling a chuck top holding the testing wafer to a probe card by vacuum attraction force, the probe card having probes to be in contact with the testing wafer;
    controlling a temperature of the testing wafer to a first temperature that is determined based on an amount of heat generated by the inspection target substrate to be simulated by using a heater pattern formed in the testing wafer to heat the testing wafer and a plurality of temperature sensors formed in the testing water and configured to measure temperatures of multiple locations on the testing wafer; and
    determining whether or not the inspection device controls the chuck top to maintain a second temperature that is an inspection temperature.

\* \* \* \* \*